March 18, 1958 L. R. JACOBSEN 2,827,521
PHASE INVERTERS OR THE LIKE
Filed Feb. 2, 1955
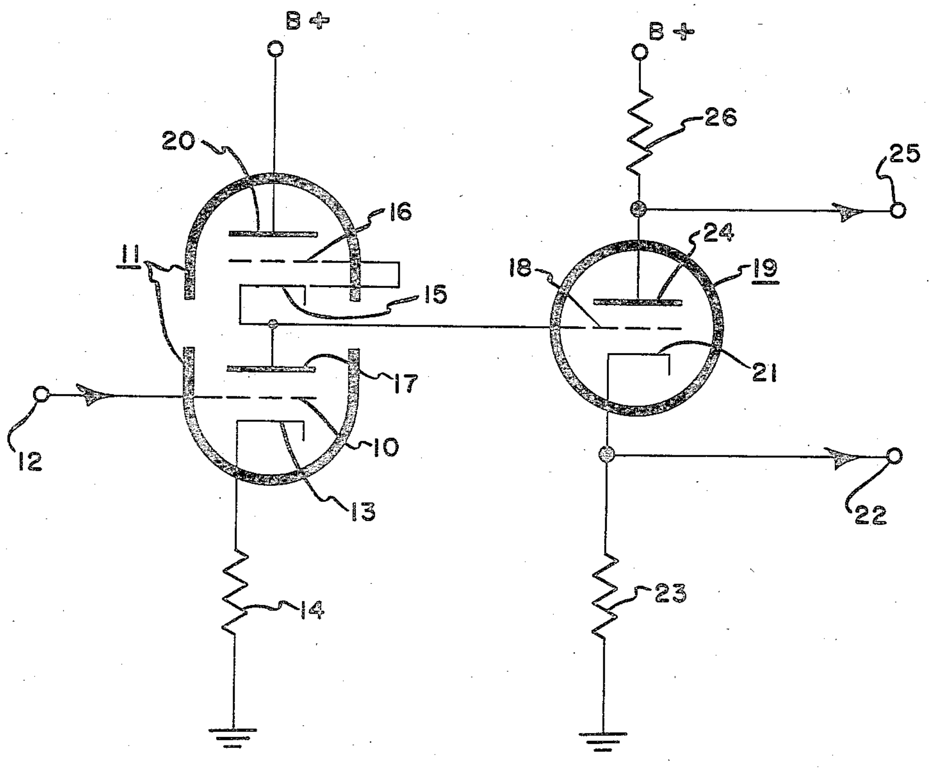
LANCE R. JACOBSEN
*INVENTOR.*
*BY* [signature]
HIS ATTORNEY United States Patent Office 2,827,521

Patented Mar. 18, 1958

2,827,521

PHASE INVERTERS OR THE LIKE

Lance R. Jacobsen, Lynwood, Calif., assignor to Hoffman Electronics Corporation, a corporation of California Application February 2, 1955, Serial No. 485,792

1 Claim. (Cl. 179—171)

This invention is related to paraphase circuits, commonly known as phase inverters, and, more particularly, to an improved phase inverter the output voltages of which will be symmetrical and free of phase shift or distortion.

Phase inverters are most commonly employed as exciter stages for push-pull amplifiers. Since it is customary to use push-pull amplification only in power stages, the problem is presented of obtaining an exciting voltage balanced to ground from an amplifier that normally develops an output voltage unsymmetrical with respect to ground. The use of an interstage coupling transformer having a symmetrical center-tap secondary is one widely used means of doing this. Transformers are, however, expensive and have a limited frequency range. A number of phase inverter circuits have been developed to supplant the interstage transformer as a driver of a push-pull amplifier. The more complex phase inverters employ the principle of tapping a portion of the output voltage of a conventional amplifier and feeding it to the input of a phase inverting tube for subsequent amplification and circuit comparison with the output voltage of the amplifier tube. The various self-balancing phase inverter circuits fall within this category. The simplest type of phase inverter employs a triode or pentode vacuum tube having an unbypassed resistor in its cathode circuit and a resistor of equivalent value in its anode circuit. While this circuit has the desirable feature of simplicity of design, yet it has some disadvantages. In the first place, in order for such a phase inverter to operate within the straight-line portion of the vacuum tube's transfer characteristic, some type of bias must be employed. The requisite bias voltage is usually supplied by an additional resistor in the tube's cathode circuit which is bypassed by a capacitor of appropriate value. However, this capacitive reactance in the tube's cathode circuit will introduce appreciable phase shift in the phase inverter's output voltages, particularly at higher frequencies. Such phase shift is to be avoided. The second disadvantage takes the form of reduced gain of such a phase inverter circuit. This type of phase inverter has a voltage gain, from an over-all aspect, approaching the value of two, assuming the amplification factor of the vacuum tube employed is high and that its anode resistance in comparison with resistor values is negligible. It would, of course, be highly desirable to increase the gain of the phase inverter itself and thus reduce the number of amplifier stages preceding the phase inverter.

Therefore, it is an object of the present invention to provide a new and useful phase inverter.

It is an additional object of this invention to provide a new and useful phase inverter which will exhibit a highly amplified symmetrical output voltage free of distortion and phase shift.

According to the present invention, a high-gain constant current amplifier of a type more fully described in applicant's co-pending application entitled "Amplifier Circuit," filed on January 27, 1955, Serial No. 484,506, drives a phase inverter consisting of a single vacuum tube having resistors of equivalent value in its anode and cathode circuits. The aforementioned constant current amplifier provides bias to the phase inverter thus permitting the tube to be operated on the linear portion of its transfer characteristic without employment of cathode bias in the phase inverter itself. The over-all gain of the amplifier-phase inverter combination will be of a value approaching twice the mu, or amplification factor, of the tube employed in the constant-current amplifier portion.

The features of the present invention which are believed to be novel are set forth with particularity in the appended claim. The present invention, both as to its organization and manner of operation, together with further objects and advantages thereof, may best be understood by reference to the following description, taken in connection with the accompanying drawing, in which:

The sole figure is a schematic diagram of a phase inverter circuit according to the present invention.

In the sole figure, control electrode 10 of duo-triode vacuum tube 11 is connected to input terminal 12, which is in turn adapted for coupling to a signal source. Cathode 13 of vacuum tube 11 is coupled through cathode resistor 14 to ground. Cathode 15 of vacuum tube 11 is directly connected to control electrode 16, anode 17, and to control electrode 18 of vacuum tube 19. Anode 20 is connected to a source of positive voltage (B+). Cathode 21 of vacuum tube 19 is connected to output terminal 22 and also to ground through cathode resistor 23. Anode 24 of vacuum tube 19 is coupled to output terminal 25 and also through anode resistor 26 to a source of positive voltage (B+).

The circuit shown in the sole figure operates as follows. Duo-triode tube 11 in conjunction with resistor 14 comprises a constant current amplifier. That is to say, the amplifier made up of duo-triode vacuum tube 11 and resistor 14 exhibits constant current despite alternations in the signal input voltage appearing at input terminal 12. The amplifier may be thought of as having a flat load-line parallel to the voltage axis of the anode characteristics graph of the tube. The anode resistances exhibited by each triode portion of vacuum tube 11 will be inversely proportional to each other. As is more fully explained in the aforementioned co-pending application, this amplifier will exhibit a constant cathode bias voltage across resistor 14 and an output voltage from the junction of anode 17 and cathode 15 having a gain approaching the mu of either triode portion of duo-triode tube 11. When considered alone, the combination of vacuum tube 19 and resistors 23 and 26 constitutes a conventional phase inverter. Circuit parameters are chosen so that with no input signal appearing at terminal 12, the voltage drop between anode 17 and ground will be less than the voltage drop across cathode resistor 23 by an amount equaling a desired bias voltage, to permit vacuum tube 19 to operate within the linear region of its characteristic. By properly choosing the operating point of vacuum tube 19 the output voltage across terminals 22 and 25 will be relatively distortion free. Absence of phase shift in the subject circuit is accomplished by the elimination of cathode bias in the cathode circuit of vacuum tube 19, the absence of a coupling capacitor between vacuum tube 11 and vacuum tube 19, and by the constant-current feature of the amplifier consisting of vacuum tube 11 and resistor 14. Since the constant-current drain through resistor 14 supplies bias to vacuum tube 11 and also to vacuum tube 19, the circuit shown should be considered as an entity within itself and not as two separate circuits. To point out the remarkable gain of the circuit shown, it may be observed that if duo-triode vacuum tube 11 comprises a 12AU7 tube having a mu of 20 and if the anode resistance of tube 19 is small in comparison with either resistor 23 or equal resistor 26, and, further, if the mu of vacuum tube 19 is sufficiently high, then the gain will approach 20 times 2 or 40. This remarkable gain is achieved without distorting the output signals from terminals 22 and 25.

Conceivably other types of conventional phase inverters may be substituted for vacuum tube 19 and its associated resistors 23 and 26 without departing from the scope of the present invention, although the circuit shown in the sole figure appears to be the most feasible. The amplifier portion consisting of vacuum tube 11 and resistor 14 may serve as a convenient means for providing simultaneously bias voltage and a high level driving signal to any phase inverter which follows.

While particular embodiments of the present invention have been shown and described, it will be obvious to those skilled in the art that changes and modifications may be made without departing from this invention in its broader aspects, and, therefore, the aim in the appended claim is to cover all such changes and modifications as fall within the true spirit and scope of this invention.

I claim:

A phase inverter including, in combination: a constant current amplifier portion and a phase inverter portion; said constant current amplifier portion consisting of a resistor and first and second series-connected electron discharge devices each having anode, cathode and control elements, said resistor being maintained at a common reference potential at one end thereof, said cathode of said first electron discharge device being directly connected to the remaining end of said resistor, said control element of said first electron discharge device being adapted for coupling to a signal source of fluctuating potential, and said anode of said second electron discharge device having an anode maintained at a positive operating potential; said phase inverter portion consisting of second and third resistors, first and second output terminals and a third electron discharge device having anode, cathode and control elements, said second resistor being maintained at a common reference potential at one end thereof, said cathode of said third electron discharge device being directly connected to the remaining end of said second resistor, said first output terminal being directly connected solely to the junction of said cathode of said third electron discharge device and said second resistor, said third resistor being maintained at a positive operating potential at one end thereof, said anode of said third electron discharge device being directly connected to the remaining end of said third resistor, said second output terminal being directly connected solely to the junction of said anode of said third electron discharge device and said third resistor, and said control electrode of said third electron discharge device, said anode of said first electron discharge device, and said control element and cathode of said second electron discharge device being directly connected solely to each other.

References Cited in the file of this patent

UNITED STATES PATENTS

| | | |
|---|---|---|
| 2,310,342 | Artzt | Feb. 9, 1943 |
| 2,679,556 | Frederick | May 25, 1954 |